350-96.17 SR
4/27/82 OR 4,326,771

United States Patent [19]
Henry et al.

[11] 4,326,771
[45] Apr. 27, 1982

[54] METHOD OF COUPLING BETWEEN AN OPTICAL FIBER AND AN OPTOELECTRONIC DIODE, AND A TRANSMITTING OR RECEIVING HEAD FABRICATED BY MEANS OF SAID METHOD

[75] Inventors: Raymond Henry; Jean-Victor Bouvet; Alain Chapard; Jacques Simon, all of Paris, France

[73] Assignee: Thomson-CSF, Paris, France

[21] Appl. No.: 193,294

[22] Filed: Oct. 2, 1980

[30] Foreign Application Priority Data

Oct. 5, 1979 [FR] France ............... 79 24891

[51] Int. Cl.³ .................... G02B 5/14; H01L 31/18
[52] U.S. Cl. .................... 350/96.17; 156/644; 29/572; 29/580; 29/588; 29/589; 250/227; 350/96.15; 350/96.17
[58] Field of Search .......... 29/572, 580, 588, 589; 156/644; 250/227; 350/96.15, 96.17, 96.20

[56] References Cited

U.S. PATENT DOCUMENTS

| 4,192,574 | 3/1980 | Henry et al. | 350/96.17 |
| 4,227,975 | 10/1980 | Hartman et al. | 204/15 |

*Primary Examiner*—Aaron Weisstuch
*Attorney, Agent, or Firm*—Oblon, Fisher, Spivak, McClelland & Maier

[57] ABSTRACT

A method of optical coupling between an optical fiber and an optoelectronic component for an optical-fiber telecommunications link is applied to the fabrication of a transmitting and/or receiving optoelectronic head. In a semiconductor wafer having a p⁻ layer and a p⁺ layer, chemical etching of the p⁻ layer is followed by n-type doping of an n⁺ layer at the bottom of the cavity and on the edge of the cavity. Highly accurate positioning of the optical fiber is thus ensured as well as excellent coupling between the fiber and the light-emitting diode or photodiode thus provided.

10 Claims, 7 Drawing Figures

METHOD OF COUPLING BETWEEN AN OPTICAL FIBER AND AN OPTOELECTRONIC DIODE, AND A TRANSMITTING OR RECEIVING HEAD FABRICATED BY MEANS OF SAID METHOD

This invention relates to a method of coupling between an optical fiber and a light-receiving or light-emitting diode as well as to an optoelectronic head constructed by means of said method.

It is known that an optoelectronic head constitutes a transition point between an optical fiber and a component, usually of the semiconductor type, which constitutes the optical terminal either at the receiving end or at the transmitting end of a telecommunications link.

In an optoelectronic head, the optical fiber usually has a very small diameter, sometimes as small as 50 microns. If the component is a receiving photodiode, the dimensions of the photodetecting surface are also very small. In a head of conventional type, the optical fiber is mounted in a fiber holder and emerges from this latter on the diode side, the photodiode being mounted on a connector socket which is adapted to the fiber holder. The respective position-locations of the fiber and of the diode must therefore be extremely accurate. The manufacture of heads of this type consequently lies in the precision engineering field and results in high production cost.

The invention makes it possible to simplify the problem of relative positioning between the fiber and the component (a photodiode, for example) by providing a novel method of coupling. To this end, there is formed in a photodiode face which is intended to be coupled to the optical fiber at least one cup-shaped cavity which may be hemispherical and in which the end of the optical fiber is to be placed.

A cavity of this type, in which provision is made for a semiconductor junction on the cavity walls, can be fabricated by chemical etching followed by diffusion of doping impurities in a semiconductor wafer.

Positioning of the end of the optical fiber can then be effected with much greater ease than in the case where a cavity of this type is not provided. Furthermore, the conventional connector socket of the optoelectronic head can be dispensed with and replaced by a simple protective element of plastic material through which are passed the leads for connection of the anode and cathode of the photodiode.

In broad outline, the method of coupling in accordance with the invention comprises the following process steps:

(a) fabrication of a semiconductor structure which is capable of constituting an optoelectronic diode by addition of a doped semiconducting layer so as to constitute with the rest of the structure a rectifying junction;

(b) formation of a cavity by chemical etching of the structure on a plane face which is intended to be coupled to the optical fiber and to provide a seating for the rectifying junction, the chemical etch being localized in a zone which is delimited by a layer of etch-resistant material;

(c) formation of the rectifying junction by doping of the semiconductor material constituting the internal wall of the cavity;

(d) fabrication of an optoelectronic head by fitting the end of an optical fiber within the cavity of the structure.

These and other features of the invention will become more apparent upon consideration of the following description and accompanying drawings, wherein.

Figure 1:
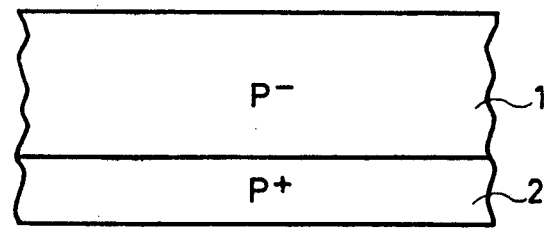
FIGS. 1 to 4 are fragmentary sectional views showing different fabrication steps of the method in accordance with the invention.

The fragmentary sectional view of FIG. 1 illustrates a semiconductor wafer comprising, for example, a $p^-$ doped substrate 1 and a $p^+$ doped layer 2. The substrate thickness is considerably greater than the diameter of the optical fiber which is intended to be coupled to the semiconductor structure after a diode such as a light-detecting diode, for example, has been formed in said structure. The fabrication of a structure of this type by conventional means constitutes the initial step (a) of the method.

Figure 2:
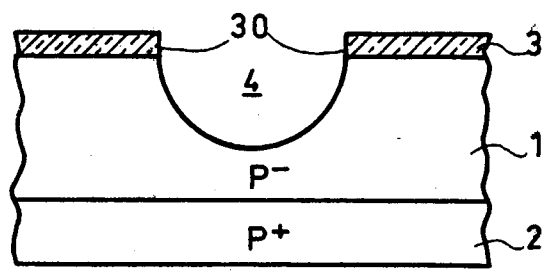
Figure 3:
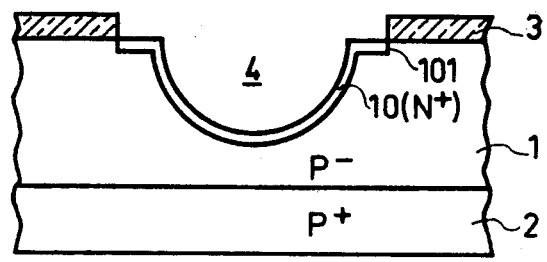

FIG. 2 illustrates the same wafer after chemical etching of that face of the substrate 1 which is remote from the layer 2. This face had previously been covered with a silica layer 3 deposited by cathodic sputtering, for example. A window 30 had also been formed in the layer 3 by conventional means such as deposition of resin subsequently removed with a solvent. These preliminary stages of the second step (b) of the method in accordance with the invention are not shown in the drawings.

During the second step (b) proper, chemical etching is carried out for example by making use of a fast agent such as a mixture of hydrofluoric acid and nitric acid in the case of a silicon substrate. There is then obtained a cavity 4 in the shape of a spherical cup.

During step (c) of the method, the semiconductor wafer which has previously been protected on all faces except the face of layer 3 is doped with an n-type impurity. Doping is continued until a high concentration ($n^+$) is attained within a layer 10 in accordance with conventional practice in photodetector diodes of the type corresponding to the example under consideration, the aim of this doping operation being to improve the quality of electrical connection at the point of contact of the diode. The layer 3 had previously been removed at the edge of the cavity 4 in order to form a doped zone 101. This operation can be performed by selective etching after protecting the rest of the layer 3.

Figure 4:
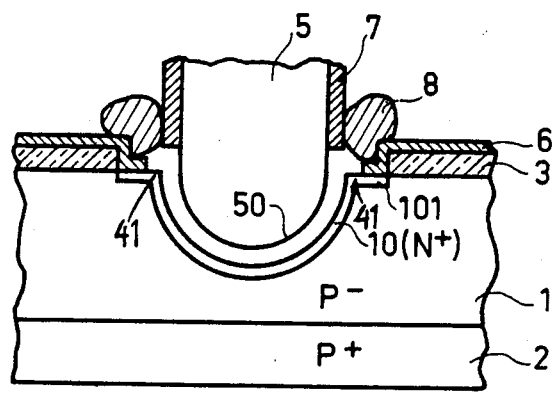

In step (d) of the method, the end 50 of an optical fiber 5 is inserted in the cavity 4 (as shown in FIG. 4). By way of example and in order to improve the optical coupling between fiber and diode, the end portion or tip 50 of the optical fiber has previously been rounded by means of one of the methods now in common use such as melting of the end of the optical fiber or the addition of a fused glass deposit.

In the embodiment shown by way of example in FIG. 4, the diode has been metallized after chemical ething of the layer 3, first in order to expose the edge 41 of the cavity 4. Provision is made for the metallic deposit 6 by forming a resist on at least part of the edge 41. FIG. 4 also shows partially an optical fiber 5, the end of which is covered with a metallic deposit 7. The metallic deposits 6 and 7 can then be connected electrically by employing an annular bead 8 of solder. Biasing of the diode can then be effected by connecting to the metallized portion of the optical fiber, which may prove an advantage in certain types of optoelectronic head.

Figure 5:
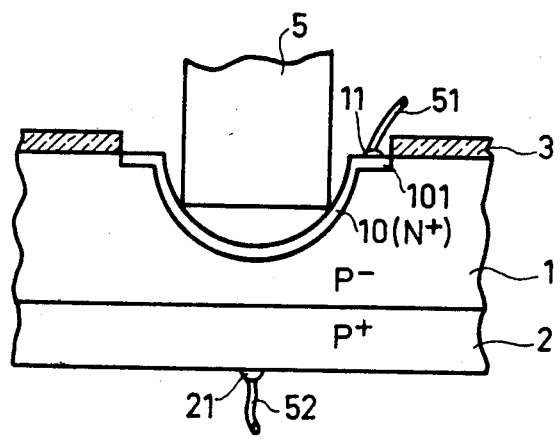
FIGS. 5 and 6 illustrate alternative embodiments of the method.

In a first simplified alternative embodiment of the invention shown in FIG. 5, it is considered sufficient to place an optical fiber 5 in position without subjecting this latter to any preliminary treatment for rounding the fiber tip to be coupled to the diode or metallizing part of the fiber. Leads 51 and 52 are soldered respectively to contacts 11 and 21 formed on the zone 101 of the n+ layer and on the p+ layer.

Figure 6:
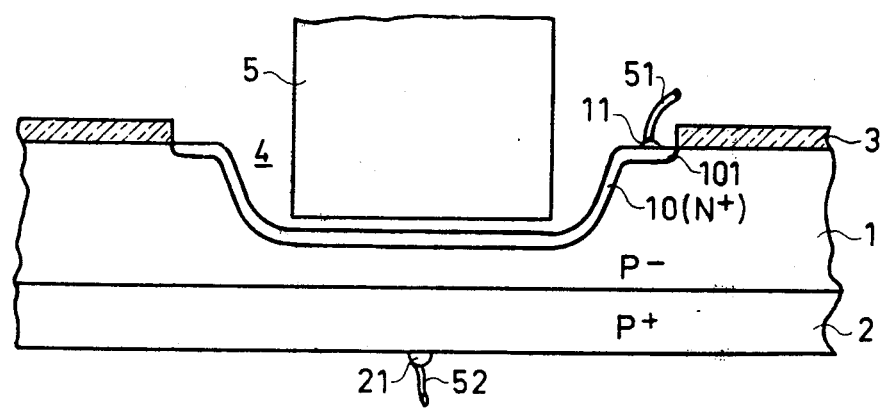

In a second simplified alternative embodiment shown in FIG. 6, the cavity 4 is formed by means of a slow chemical etchant. The cavity thus obtained under these conditions has a flat bottom wall. Coupling of the diode with an optical fiber having a right-section end face as in the first alternative embodiment is better than in the case of a cavity having the shape of a spherical cup or well. Lead connections are formed in the same manner as in the first alternative embodiment.

The method in accordance with the invention permits the fabrication of an optoelectronic head which offers the advantages of greater simplicity and smaller volume than conventional heads.

Figure 7:
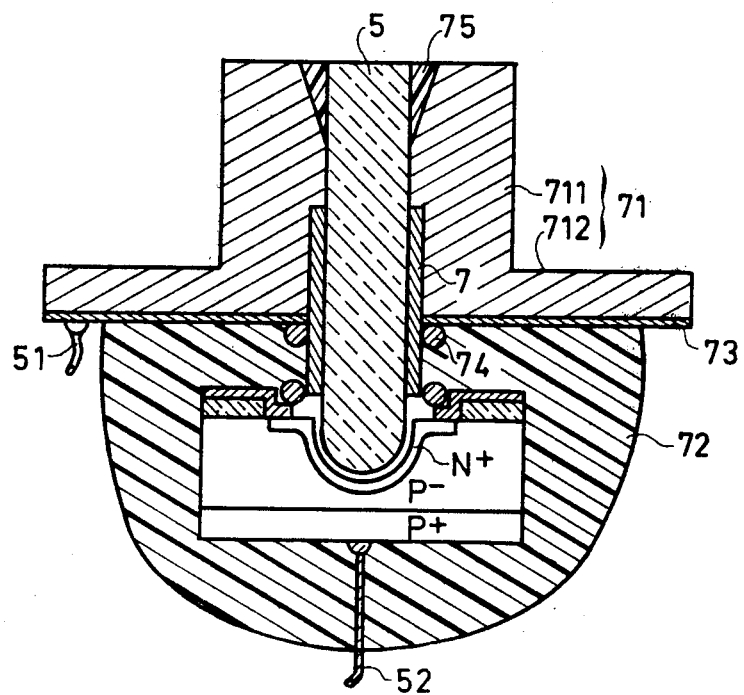
FIG. 7 illustrates an optoelectronic head fabricated by means of the method in accordance with the invention.

If the embodiment shown in FIG. 4 is adopted as a conceptual basis for the fabrication of an optoelectronic head, it is only necessary to add to the starting device a fiber holder 71 and a coating 72 of synthetic resin, for example. The lead 51 (n+ type layer) is connected to the metallization deposit 7 of the optical fiber 5 by coating that face of the base 712 of the fiber holder which is nearest the diode with a metallization deposit 73. The metallic deposits 7 and 73 are joined together by means of a bead 74 of solder. The end component 711 of the fiber holder is provided with a flared central opening 75 of sufficient width to maintain the optical fiber in position by means of an adhesive substance or resin. It should be noted for the sake of enhanced clarity that FIG. 7 has not been drawn to scale. In actual practice, the diameter of the optical fiber is of the order of one tenth of a millimeter whilst the end component 711 and the base 712 have respective diameters of 3 and 20 mm. As to the contact with the p+ layer, this latter is connected by means of a lead 52 which passes through the outer coating 72.

The invention is applicable to electroluminescent diodes as well as to photodetector diodes fitted in terminal equipment systems forming part of optical "links" for short-distance and medium-distance transmission.

What is claimed is:

1. A method of coupling between an optical fiber and an optoelectronic diode, wherein said method comprises the following steps:
   (a) fabrication of a semiconductor structure which is capable of constituting an optoelectronic diode by addition of a doped semiconducting layer so as to constitute with the rest of the structure a rectifying junction;
   (b) formation of a cavity by chemical etching of the structure on a plane face which is intended to be coupled to the optical fiber and to provide a seating for the rectifying junction, the chemical etch being localized in a zone which is delimited by a layer of etch-resistant material;
   (c) formation of the rectifying junction by doping of the semiconductor material constituting the internal wall of the cavity;
   (d) fabrication of an optoelectronic head by fitting the end of an optical fiber within the cavity of the structure.

2. A method according to claim 1, wherein said method comprises an additional step to be performed between the steps (c) and (d) aforesaid and wherein said additional step consists in rounding the end of the optical fiber which is intended to be fitted within the cavity.

3. A method according to claim 1 wherein, during step (b), chemical etching is carried out by means of a fast-action etchant in order to obtain a cavity having the shape of a spherical cup.

4. A method according to claim 1 wherein, during step (b), chemical etching is carried out by means of a slow-action etchant in order to obtain a cavity having a flat end-wall.

5. A method according to claim 1 wherein, during step (c), the zone delimited by the layer of etch-resistant material of the preceding step is enlarged by removing said material at the edge of the cavity.

6. A method according to claim 5, wherein a first metallic coating is deposited at the edge of the cavity and a second metallic coating is deposited on a portion of the fiber located in the vicinity of the point of coupling of said fiber with the diode while ensuring that the tip of the fiber is left free and wherein a soldering operation is performed so as to join the two metallic coatings together.

7. An optoelectronic head obtained by means of a method according to claim 1, wherein electrical connecting leads are connected to contacts formed on semiconducting zones of opposite conductivity types forming part of the diode.

8. An optoelectronic head obtained by means of a method according to claim 6, wherein a first electric lead is connected to the metallic coating of the optical fiber, a second electric lead being connected to the diode.

9. An optoelectronic head according to claim 8, wherein said head comprises a fiber holder and an outer coating which surrounds the diode.

10. An optoelectronic head according to claim 9, wherein the fiber holder is provided with a metallized base in contact with the metallic coating of the optical fiber, the first electric lead being connected to said metallic coating by means of said base.

* * * * *